US012687743B2

(12) United States Patent
Daube et al.

(10) Patent No.: US 12,687,743 B2
(45) Date of Patent: *Jul. 21, 2026

(54) CONTACT LENSES WITH MULTIPLE POWER SOURCES

(71) Applicant: Snap Inc., Santa Monica, CA (US)

(72) Inventors: Nir Daube, Pacific Palisades, CA (US); Russell Douglas Patton, Playa Vista, CA (US); Jonathan M. Rodriguez, II, La Habra, CA (US)

(73) Assignee: Snap Inc., Santa Monica, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 18/649,770

(22) Filed: Apr. 29, 2024

(65) Prior Publication Data

US 2024/0280835 A1        Aug. 22, 2024

Related U.S. Application Data

(63) Continuation of application No. 17/005,664, filed on Aug. 28, 2020, now Pat. No. 12,001,085.

(60) Provisional application No. 62/907,770, filed on Sep. 30, 2019.

(51) Int. Cl.
*G02C 7/08* (2006.01)
*G02C 7/04* (2006.01)
*H10F 10/00* (2025.01)

(52) U.S. Cl.
CPC ............. *G02C 7/047* (2013.01); *G02C 7/083* (2013.01); *H10F 10/00* (2025.01)

(58) Field of Classification Search
CPC ........ G02C 7/047; G02C 7/083; G02C 11/10; G02C 7/04; H10F 10/00
See application file for complete search history.

(56) References Cited

U.S. PATENT DOCUMENTS

| | | | | |
|---|---|---|---|---|
| 9,823,737 B2 * | 11/2017 | Mazed | .................... | G06F 3/017 |
| 11,337,215 B2 * | 5/2022 | Park | .......................... | H04B 5/20 |
| 12,001,085 B1 | 6/2024 | Daube et al. | | |
| 2008/0208335 A1 * | 8/2008 | Blum | .................... | G02B 1/043 |
| | | | | 623/6.22 |
| 2010/0110372 A1 * | 5/2010 | Pugh | ................ | B29D 11/00009 |
| | | | | 351/159.75 |
| 2014/0192311 A1 * | 7/2014 | Pletcher | ................. | G02C 11/10 |
| | | | | 351/158 |

* cited by examiner

*Primary Examiner* — Mustak Choudhury
(74) *Attorney, Agent, or Firm* — CM Law; Stephen J. Weed

(57) ABSTRACT

Apparatus and methods are disclosed that relate to contact lenses having multiple power sources. In particular, in one aspect, a contact lens can include a transparent substrate and a circuit. The circuit can include one or more sensors, circuitry, one or more photovoltaic cells disposed on or within at least a portion of the substrate, and a hybrid power component that supplies power to the circuitry that includes solar power.

17 Claims, 4 Drawing Sheets

100

104

200

CONTACT LENSES WITH MULTIPLE POWER SOURCES

CROSS-REFERENCE TO RELATED APPLICATIONS

This application is a Continuation of U.S. application Ser. No. 17/005,664 filed on Aug. 28, 2020, which claims priority to U.S. Provisional Application Ser. No. 62/907,770 filed on Sep. 30, 2019, the contents of both of which are incorporated fully herein by reference.

TECHNICAL FIELD

This disclosure generally relates to contact lenses having power sources.

BACKGROUND

Electronic devices require energy sources. Such devices may be incorporated in small scale applications.

DETAILED DESCRIPTION

Figure 1:
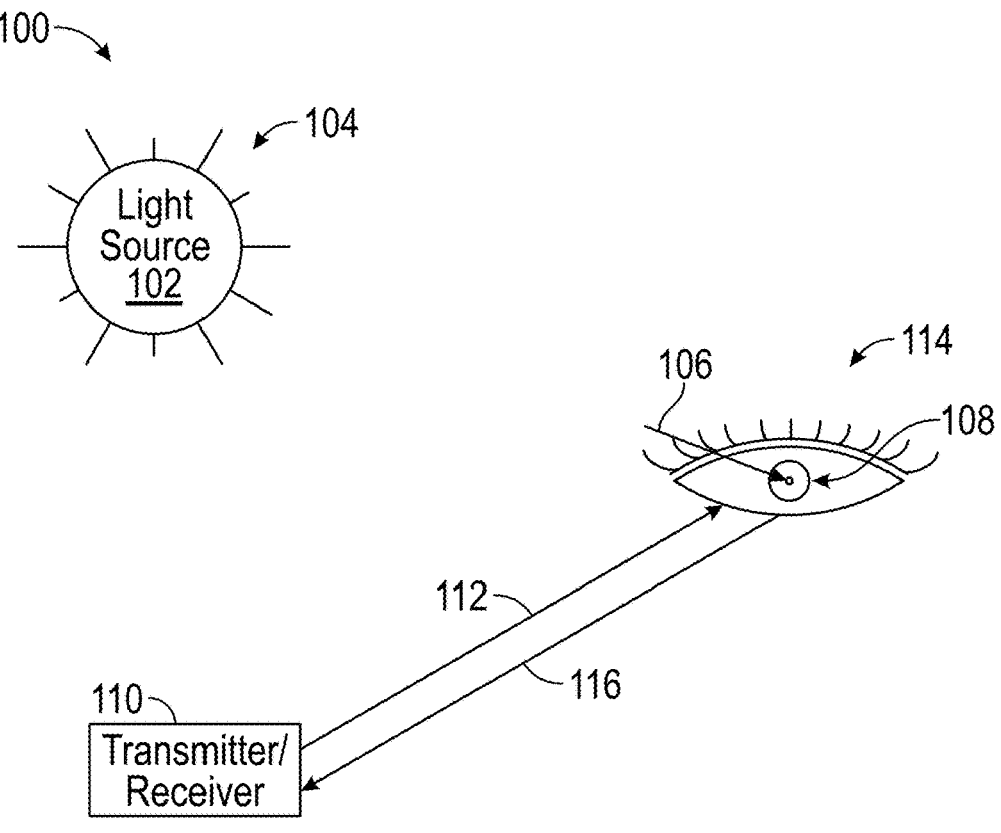
FIG. 1 is an illustration of a block diagram of an example non-limiting system that facilitates contact lenses having hybrid power sources in accordance with aspects described herein.

Various aspects are now described with reference to the drawings, wherein like reference numerals are used to refer to like elements throughout. In the following description, for purposes of explanation, numerous specific details are set forth in order to provide a more thorough understanding of one or more aspects. It is evident, however, that such aspects can be practiced without these specific details. In other instances, structures and devices are shown in block diagram form in order to facilitate describing one or more aspects.

Apparatus and methods disclosed herein relate to contact lenses having hybrid power sources. In particular, in one aspect, a contact lens can include a transparent substrate and a circuit, and the circuit can include one or more sensors, circuitry, and one or more photovoltaic cells disposed on or within at least a portion of the substrate, and a hybrid power component that supplies power to the circuitry, wherein at least one type of power is solar power.

In another aspect, a method can include: supplying, from a hybrid power component on or within the contact lens, at least one of two or more different types of power to circuitry disposed on or within the contact lens, wherein at least one of the two or more different types of power is solar power; and performing one or more operations, by the circuitry, in response to receiving the supplied power.

In another aspect, a method can include: determining at least one of a type of operation performed via the contact lens or an environment outside of the contact lens; selecting a type of power based, at least, on the type of the operation or the environment outside of the contact lens; and outputting the type of the power.

One or more aspects of the apparatus or methods described herein can advantageously facilitate two or more different forms of power supply on contact lenses. In various aspects, the different forms of power can be supplied continuously, intermittently, or periodically, based on various conditions.

FIG. 1 is an illustration of a block diagram of an example non-limiting system that facilitates contact lenses having hybrid power sources in accordance with aspects described herein.

The system 100 can include a light source 102 that emits light rays 104 (resulting in light 106 incident on the contact lens 108), an transmitter/receiver 110 that emits radiofrequency energy 112, a contact lens 108 positioned on an eye 114 of a wearer of the contact lens and having a circuit (not shown). The circuit can include photovoltaic or solar cells (not shown), one or more sensors (not shown), a hybrid power component (not shown), or circuitry (not shown) disposed on or within a substrate of the contact lens 108.

The hybrid power component can supply different types of power in connection with the contact lens 108. For example, the hybrid power component can select a type of power to output from the hybrid power component. The power output can be supplied to the circuit, one or more sensors any other portions of the contact lens 108 that employ power. In various aspects, the different types of power that the hybrid power component can output can include, but are not limited to, solar power, microelectrical mechanical systems (MEMS)-generated electric power, or radiofrequency/inductive power.

In various aspects, solar power can be received from sunlight or ambient light incident on photovoltaic cells of the contact lens 108. In some aspects, the MEMS-based power can be generated based, at least, on one or more MEMS devices on the contact lens 108. The MEMS devices can be adapted to generate power based, at least, on for example stress and corresponding deformation applied to the contact lens 108 when the wearer of the contact lens 108 blinks and the eyelid applies pressure to the contact lens 108 while the eyelid is closed. In some aspects, the radiofrequency/inductive power can be received from an transmitter/receiver, for example, such power can be received via an antenna on the contact lens 108.

In various aspects, the contact lens 108 can output information 116 to the transmitter/receiver 110 in response to detecting that the transmitter/receiver 110 is within proximity to the contact lens 108. For example, in some aspects, the contact lens 108 can include information sensed by the one or more sensors.

In some aspects, the system 100 includes the contact lens 108 having the circuit that includes one or more sensors, one or more photovoltaic or solar cells, the microelectromechanical system (MEMS) components, radiofrequency components (e.g., antenna), a power storage or circuitry disposed on or within a substrate of the contact lens.

Figure 2:
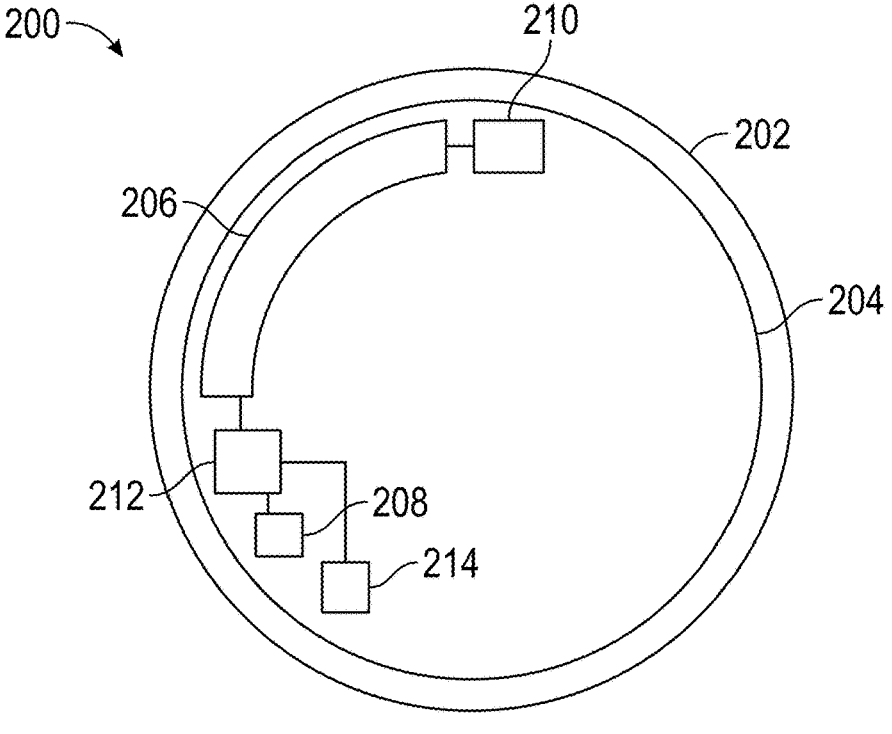
FIG. 2 is an illustration of a block diagram of example non-limiting contact lenses having hybrid power sources in accordance with aspects described herein.

Various aspects of the contact lens will be described with reference to FIGS. 2 and 3. FIG. 2 is an illustrations of a block diagram of example non-limiting contact lenses having hybrid power sources in accordance with aspects described herein.

Referring to FIG. 2, the contact lens 200 can include a substrate 202. In some aspects, the substrate 202 is formed to cover at least a portion of an iris of an eye. In some aspects, the substrate 202 is formed as a ring. In various aspects, one or more portions of the substrate 202 can be transparent or translucent. In some aspects, the substrate 202 can be flexible or semi-rigid.

The contact lens 200 can include a circuit 204 disposed on or within the substrate 202. For example, in some aspects, the circuit 204 can be encapsulated in the substrate 202. In various aspects, the circuit 204 can include a number of photovoltaic or solar cells or sensors communicatively or electrically coupled to one another and having one or more different functions. The photovoltaic cells can be flexible and in some aspects are based on organic compounds. In one aspect, the photovoltaic cells can be or include graphene. The organic polymers can be or include polyphenylene vinylene or copper phthalocyanine in some aspects. In various aspects, the photovoltaic cells can be formed from or include biocompatible organic dyes, thin films, organic polymers or nanocrystals in various aspects. The nanocrystals can be based on silicon, cadmium telluride or copper indium gallium (di)selenide. While the term "photovoltaic cell" has been used herein, in various aspects, solar cells can be employed in lieu of or in addition to the one or more photovoltaic cells.

As shown in FIG. 2, in some aspects, the circuit 204 can include one or more photovoltaic cells 206, a sensor 208, a power storage component 210, a hybrid power component 212, or circuitry 214. In various aspects, the one or more photovoltaic cells 206, sensor 208, power storage component 210, hybrid power component 212 or circuitry 214 can be operably, electrically or communicatively coupled to one another to perform one or more functions performed on or via the contact lens 200. One or more of the photovoltaic cells 206, sensor 208, power storage component 210, hybrid power component 212 or circuitry 214 can be disposed on or within the substrate 202 and, as shown in FIG. 2, along a perimeter of the substrate 202. Other examples of configurations include semi-circular arrangements, square or rectangular arrangements of components positioned around the periphery of the iris, for example, or the like.

In some aspects, the sensor 208 can sense information associated with the wearer of the contact lens 200 (or information associated with an environment outside of the contact lens). Accordingly, in various aspects, the sensor 208 can sense molecules or compounds indicative of the metabolic status in a body of a wearer of contact lens 200. By way of example, the sensor 208 can sense the level of lactate, glucose, cholesterol or urea in the body of the wearer of the contact lens 200. In some aspects, the sensor 208 can sense other features, including, but not limited to, pressure, light, acceleration, temperature or strain. In various aspects, the sensors can be positioned over the surface of the substrate 202 in any number of different configurations and can be transparent or translucent in order to enable a wearer of the contact lens 200 to view a sufficient portion of the environment outside of the contact lens 200. Accordingly, different numbers, configurations or transparency levels of the sensors or other components of the contact lens are envisaged herein and can be implemented according to space or design considerations.

In some aspects, the one or more photovoltaic cells 206 can receive light incident on the photovoltaic cells 206. In various aspects, the light can be sunlight or ambient light. In some aspects, the photovoltaic cell 206 can generate solar power based on the received light. In various aspects, the one or more photovoltaic cells 206 can output solar energy to the hybrid power component 212.

In some aspects, the one or more photovoltaic cells 206 can output solar power to trickle charge a storage capacitor (not shown) of the power storage component 210, to enable a memory (not shown) in the circuit 204 to retain state information or to enable the sensor 208 to sense information associated with the wearer of the contact lens 200 (or about an environment outside of the contact lens). For example, in some aspects, the photovoltaic cell(s) 206 can convert the light received into electricity. The electricity can be output at a rate that is approximately equal to the rate of discharge of the electrical charge of the storage capacitor. As such, the rate of electricity output from the photovoltaic cell 206 can be such that the storage capacitor receives a trickle charge. In other aspects, the power storage component 210 can be or include a thin film battery or a rechargeable ceramic battery. In another aspect, the rechargeable ceramic battery is a rechargeable multilayer ceramic battery.

In various aspects, the one or more photovoltaic cells 206 can be disposed across the surface of the substrate 202 in various configurations. In these aspects, one or more of the photovoltaic cells 206 can be transparent or translucent in order to enable a wearer of the contact lens 200 to view a sufficient portion of the environment outside of the contact lens 200. In some aspects, one or more of the photovoltaic cells 206 may be transparent to permit placement over the pupil.

The power storage component 210 can store power from the photovoltaic cell(s) 206. In various aspects, the power storage component 210 can include a storage capacitor (not shown) that can store a charge based on the power stored at the power storage component 210. The stored power can be employed for one or more different functions of the contact lens 200. For example, the stored power can be employed to retain state information in the memory of the circuitry 214. The stored power can be employed to retain state information by maintaining the memory of the circuitry 214 in an on state or in a state such that the state information stored in the memory is not erased.

The circuitry 214 can perform one or more functions including, but not limited to, processing information sensed by the sensor 208, communicating with an external device (e.g., transmitter/receiver 110), processing information or the like. In some aspects, the circuitry 214 can determine the information (e.g., light, temperature, glucose level, or lactate) sensed at the sensor 208 or output such information.

The hybrid power component 212 will be described in detail with reference to FIGS. 2 and 3. FIG. 3 is an illustration of a block diagram of an example non-limiting hybrid power component that facilitates contact lenses having hybrid power sources in accordance with aspects described herein. The hybrid power component 212 can select or output different types of power to the circuit of the contact lens in various aspects. It is to be appreciated that respective power sources described herein can be employed to provide power to a storage device (e.g., capacitor, battery, etc.) or directly provide power to devices or circuitry. Moreover, one or more of the power sources can be employed individually or in cooperation with other power sources. The hybrid power component can select optimal power sources to employ given state of user, device, environment, etc.

Figure 3:
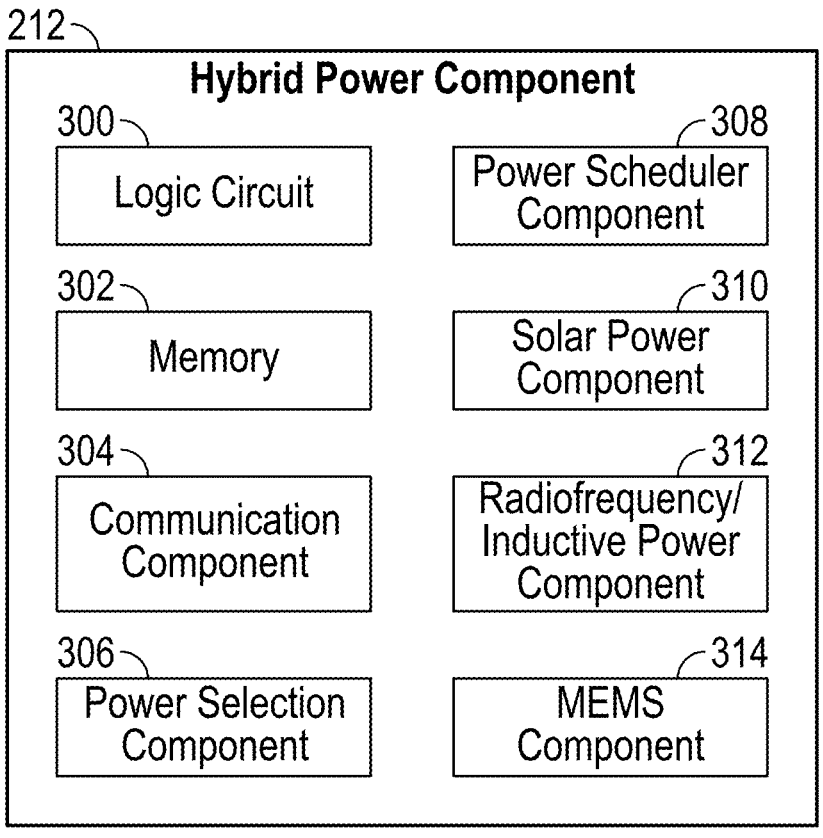
FIG. 3 is an illustration of a block diagram of an example non-limiting hybrid power component that facilitates contact lenses having hybrid power sources in accordance with aspects described herein.

With reference to FIG. 3, the hybrid power component 212 can include a logic circuit 300, memory 302, a communication component 304, power selection component 306, power scheduling component 308, solar power component 310, radiofrequency/inductive power component 312, or MEMS power component 314. In some aspects, one or more of the communication component 304, power selection component 306, power scheduling component 308, radiofrequency/inductive power component 312, solar power component 310, MEMS power component 314, or logic circuit 300 can be electrically or communicatively coupled to one another to perform one or more functions of the hybrid power component 212.

The communication component 304 can transmit or receive information. For example, the communication component 304 can transmit information indicative of the features sensed by the sensor 208. As another example, the communication component 304 can receive information or energy from a radiofrequency transmitter, light source or the like.

The power selection component 306 can select a type of power to output from the hybrid power component 212. For example, the hybrid power component 212 can supply different types of power to the circuitry 204, sensor 208 or any other portions of the contact lens 200. In various aspects, the different types of power can include, but are not limited to, radiofrequency/inductive power, solar power or MEMS-generated electric power.

The radiofrequency/inductive power component 312 can receive radiofrequency energy from an transmitter/receiver. In some aspects, the transmitter/receiver can be transmitter/receiver 110. In some aspects, the inductive power component 312 can include an antenna that can receive the radiofrequency or inductive energy, such as, for example but not limitation, radio waves having a frequency of between 2.4 GHz to 2.5 GHz known as "Power over WiFi" (PoWiFi), Bluetooth®, etc. The inductive power component 312 can employ the received radiofrequency energy to generate inductive power in some aspects. The inductive power can be output from the hybrid power component 212 to the sensor 208, circuitry 204 or any of the components of the contact lens 200.

The solar power component 310 can receive solar energy from sunlight or ambient light incident on the one or more photovoltaic cells 206 of the contact lens 200. The solar power component 310 can employ the received solar energy to generate solar power in some aspects. The solar power can be output from the hybrid power component 212 to the sensor 208, circuitry 214 or any of the components of the contact lens 200.

The MEMS power component 314 can generate electric power. In some aspects, the MEMS power component 314 can include one or more MEMS devices adapted to generate power based, at least, on the stress and corresponding deformation applied to the contact lens when the wearer of the contact lens 200 blinks. As such, electric power can be output from the hybrid power component 212 to the sensor 208, circuitry 214 or any of the components of the contact lens 200.

The power scheduling component 308 can cause the hybrid power component 212 to output different types of power continually, intermittently, periodically, based upon a condition being satisfied, based on an environment outside of the contact lens 200 or based on the operations performed on or via the contact lens 200, as described below.

For example, in various aspects, the power scheduling component 308 can cause one or more different types of power to be supplied from the hybrid power component 212 concurrently or in series. For example, in aspects wherein the different types of power are supplied in series, at a first time, a first type of power can be supplied and at a second time, a second type of power can be supplied. By way of example, but not limitation, inductive power can be output at a first time, solar power can be output at a second time and inductive power can be output again at a third time. The type of power output can be alternated between any number of different types of power. Accordingly, one or more different types of power can be intermittently output in sequence from the hybrid power component 212.

In some aspects, the power scheduling component 308 can cause the hybrid power component 212 to output the one or more different types of power based on one or more different environmental conditions (e.g., time of day, hour, weather condition indicating whether light is available to power the one or more photovoltaic cells 206 (e.g., level of fog or overcast conditions in the environment)). In various aspects, the time at which particular power is output can be static or dynamically-determined.

In some aspects, the power scheduling component 308 can cause the hybrid power component 212 to output the one or more different types of power based on whether a particular source of power is available to the hybrid power component 212. For example, if a light source is available, the hybrid power component 212 can generate and output solar power. As another example, if a transmitter/receiver is available, the hybrid power component can receive energy from the transmitter and generate and output radiofrequency inductive power. As another example, if neither solar nor radiofrequency energy is available, the hybrid power supply can output MEMS-generated electric power.

In some aspects, the power scheduling component 308 can cause the hybrid power component 212 to output the one or more different types of power based on the type of operations performed on or via the contact lens 200 (or sensor 208 or circuitry 214 of the contact lens 200). For example, a first type of operation can require a first level of power and a second type of operation can require a second level of power. The operations can include, but are not limited to, sensing, processing, communication or any of a number of different types of operations performed on or via the circuit 204. The hybrid power component 212 can output a type of power that meets or exceeds the level of power required for the operation to be performed.

In some aspects, the power scheduling component 308 can cause the hybrid power component 212 to output power periodically. For example, the hybrid power component 212 can awake and output power at periodic intervals to enable the contact lens 200 to perform sensing, communication or any number of other different types of functions. In some aspects, the hybrid power component 212 can awake at periodic intervals and the circuit 214 can output information indicative of sensed information. The information can be output to receiver 110, etc.

The hybrid power component 212 can include a memory 302 and a logic circuit 300. For example, the memory 302 can be a computer-readable storage medium storing computer-executable instructions or information for performing the functions described in this disclosure with reference to the contact lens 200 (or components thereof). The logic circuit 300 can perform one or more of the functions described in this disclosure with reference to the contact lens 200 (or components thereof).

Referring back to FIG. 2, although not shown, in various aspects, the contact lens 200 can include a memory or logic circuit separate from the memory 302 and the logic circuit 300. In various aspects, a single memory and a single logic circuit can be employed on the contact lens 200.

Figure 4:
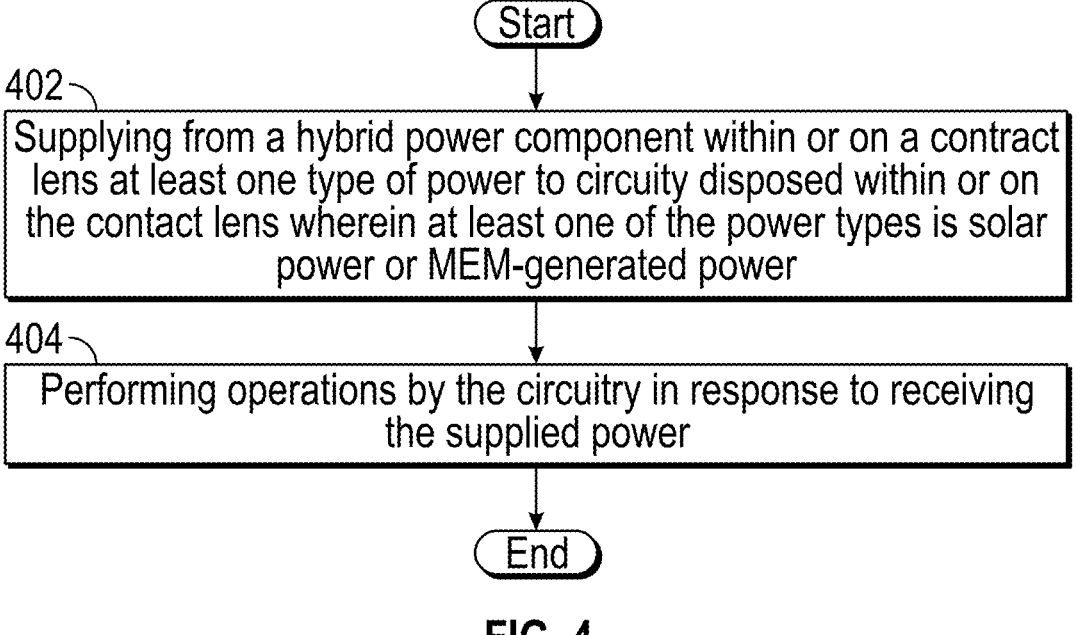
FIGS. 4, 5, and 6 are illustrations of example flow diagrams of methods that facilitate contact lenses having hybrid power sources in accordance with aspects described herein.
Figure 5:
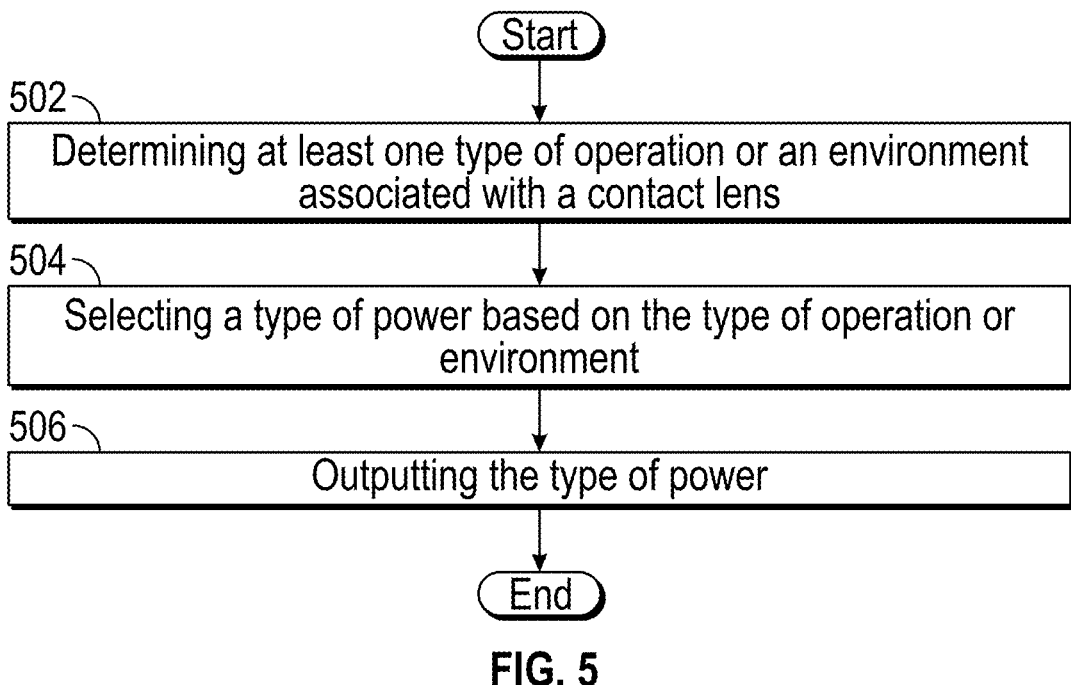
Figure 6:
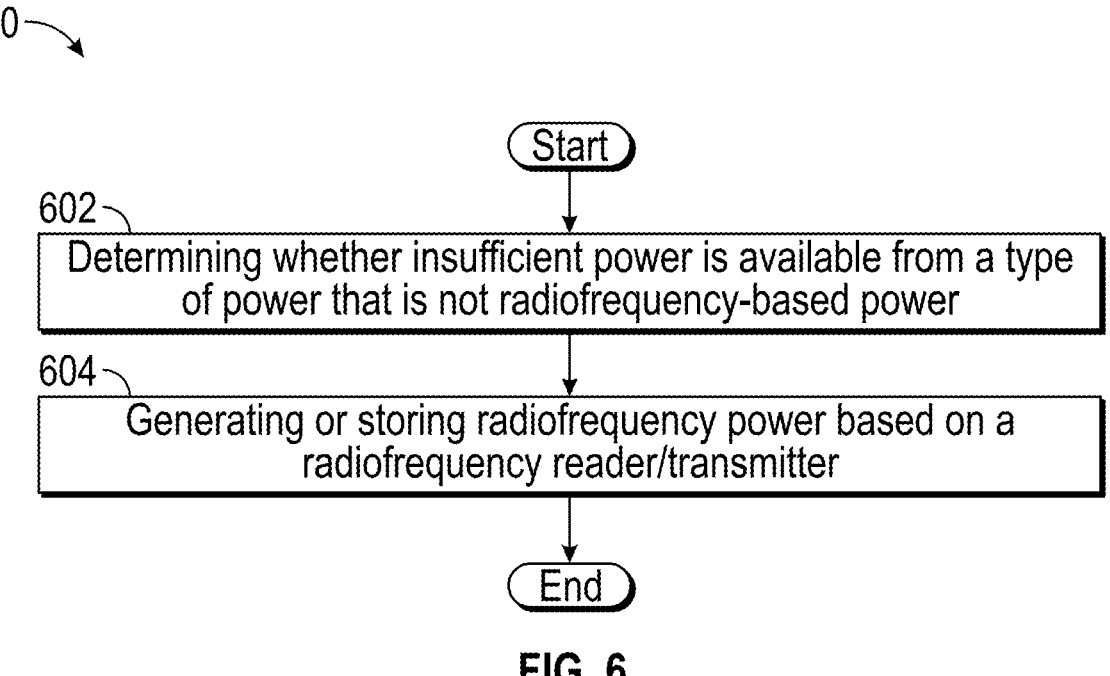

FIGS. 4, 5, and 6 are illustrations of example flow diagrams of methods that facilitate contact lenses having hybrid power sources in accordance with aspects described herein. Turning to FIG. 4, at 402, the method includes supplying, from a hybrid power component on or within the contact lens, at least one of two or more different types of power to circuitry disposed on or within the contact lens, wherein at least one of the different types of power is solar power (e.g., using the hybrid power component 212). In some aspects, two or more different types of power can be supplied to the circuitry. For example, MEMS or radio frequency power can be supplied to the circuitry.

In some aspects, the power can be supplied intermittently. For example, at a first time, a first type of power can be supplied and at a second time, a second type of power can be supplied.

The time at which a particular type of power is output can be static or dynamically-determined based on any number of factors including, but not limited to, the environment of the contact lens wearer. For example, in various aspects, the type of power supplied can be based on whether a particular source of power is available to the hybrid power component. For example, if a radiofrequency transmitter is available, the hybrid power component can receive radiofrequency energy from the transmitter and output radiofrequency/inductive power. As another example, if neither solar nor radiofrequency energy is available (e.g., the environment is void of light and is not near an radiofrequency transmitter/receiver), the hybrid power supply can output MEMS-generated electric power.

In some aspects, the type of power supplied can be based on the operations performed by the circuitry. For example, a first type of operation can require a first level of power and a second type of operation can require a second level of power. The hybrid power component can output a type of power that meets or exceeds the power required for the operation.

At 404, the method includes performing one or more operations, by the circuitry, in response to receiving the supplied power (e.g., using the circuit 204). By way of example, the operations can include sensing, processing, communication or any of a number of different types of operations performed via circuit 204.

Referring to FIG. 5, at 502, the method includes determining at least one of a type of operation or an environment associated with the contact lens (e.g., using the hybrid power component 212). In some aspects, the environment can be a time of day (e.g., nighttime, twilight, daytime or hour), an indicator of whether light is available to power photovoltaic cells (e.g., level of fog or overcast conditions in the environment), whether a radiofrequency transmitter (and optionally receiver) is within a particular geographic proximity to the circuit 204 or the like. In aspects, the operation type can include, but is not limited to, sensing, communication or the like.

At 504, the method includes selecting a type of power based, at least, on the type of the operation or environment (e.g., using the hybrid power component 212). For example, the type of power can be solar, MEMS-generated, or radio frequency power and can be determined based on whether sensing is being performed, for example. As another example, the type of power can be based on whether nighttime conditions exist, for example, and solar power is not available.

At 506, the method includes outputting the type of the power (e.g., using the hybrid power component 212). In various aspects, the power can be output continually or intermittently.

As one example, in some aspects, two or more different types of power can be intermittently output in sequence from the hybrid power component. By way of example, but not limitation, solar power can be output at a first time, radiofrequency/inductive power can be output at a second time and solar can be output again at a third time. The type of power output can be alternated between any number of different types of power.

In another example, power can be output periodically. In another example, power of a first type can be output during a time period corresponding to a first type of operation or environmental condition while power of a second type can be output during a time period corresponding to a second type of operation or environmental condition.

Referring now to FIG. 6, at 602, method 600 can include determining whether there is insufficient power available from solar or MEMS or another type of power that is not radiofrequency-based power.

At 604, method 600 can include generating or storing radiofrequency/inductive power based, at least, on insufficient power from solar or MEMS or another non-radiofrequency-based power, and the transmitter/receiver being within range. For example, the radiofrequency/inductive power can be generated upon receiving a signal from the radiofrequency transmitter 110.

Figure 7:
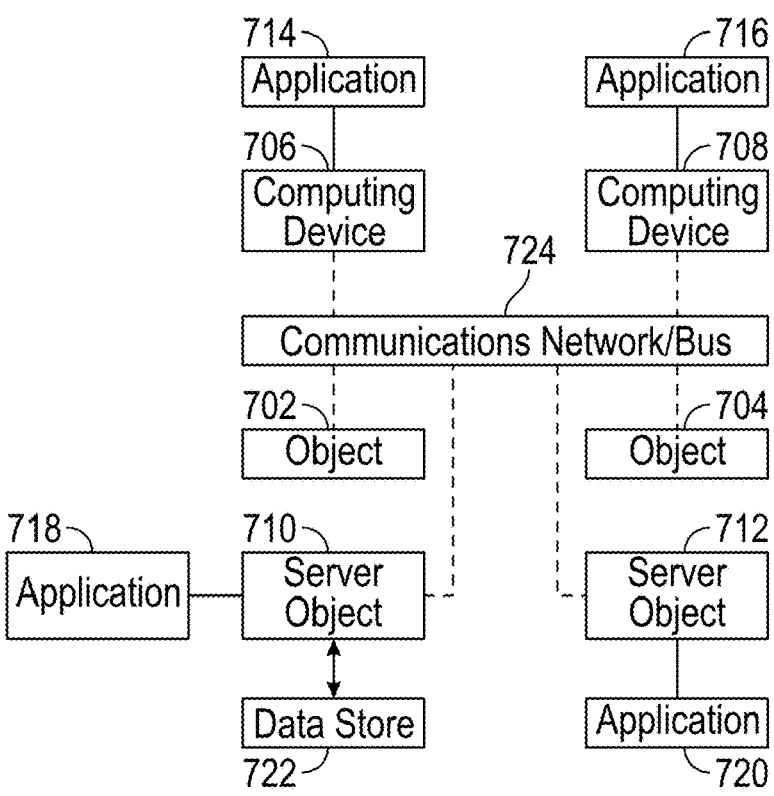
FIG. 7 is an illustration of a schematic diagram of an example networked or distributed computing environment for implementing one or more aspects described herein.

FIG. 7 provides a schematic diagram of an example networked or distributed computing environment with which one or more aspects described in this disclosure can be associated. The distributed computing environment includes computing objects 702, 704, etc. and computing objects or devices 706, 708, 710, 712, etc., which can include programs, methods, data stores, programmable logic, etc., as represented by applications 714, 716, 718, 720, 722. It can be appreciated that computing objects 702, 704, etc. and computing objects or devices 706, 708, 710, 712, etc. can include different devices, such as active contact lenses (and components thereof), personal digital assistants (PDAs), audio/video devices, mobile phones, MPEG-1 Audio Layer 3 (MP3) players, personal computers, laptops, tablets, etc.

Each computing object 702, 704, etc. and computing objects or devices 706, 708, 710, 712, etc. can communicate with one or more other computing objects 702, 704, etc. and computing objects or devices 706, 708, 710, 712, etc. by way of the communications network 724, either directly or indirectly. Even though illustrated as a single element in FIG. 7, network 724 can include other computing objects and computing devices that provide services to the system of FIG. 7, or can represent multiple interconnected networks, which are not shown.

In a network environment in which the communications network/bus 724 can be the Internet, the computing objects 702, 704, etc. can be Web servers, file servers, media servers, etc. with which the client computing objects or devices 706, 708, 710, 712, etc. communicate via any of a number of known protocols, such as the hypertext transfer protocol (HTTP).

As mentioned, advantageously, the techniques described in this disclosure can be associated with any suitable device. It is to be understood, therefore, that handheld, portable and other computing devices (including active contact lens having circuitry or components that compute or perform various functions). As described, in some aspects, the device can be the contact lens (or components of the contact lens) or transmitter/receiver described herein. In various aspects, the data store can include or be included within, any of the memory described herein, any of the contact lenses described herein or the radiofrequency transmitter/receiver described herein. In various aspects, the data store can be any repository for storing information transmitted to or received from the contact lens.

Figure 8:
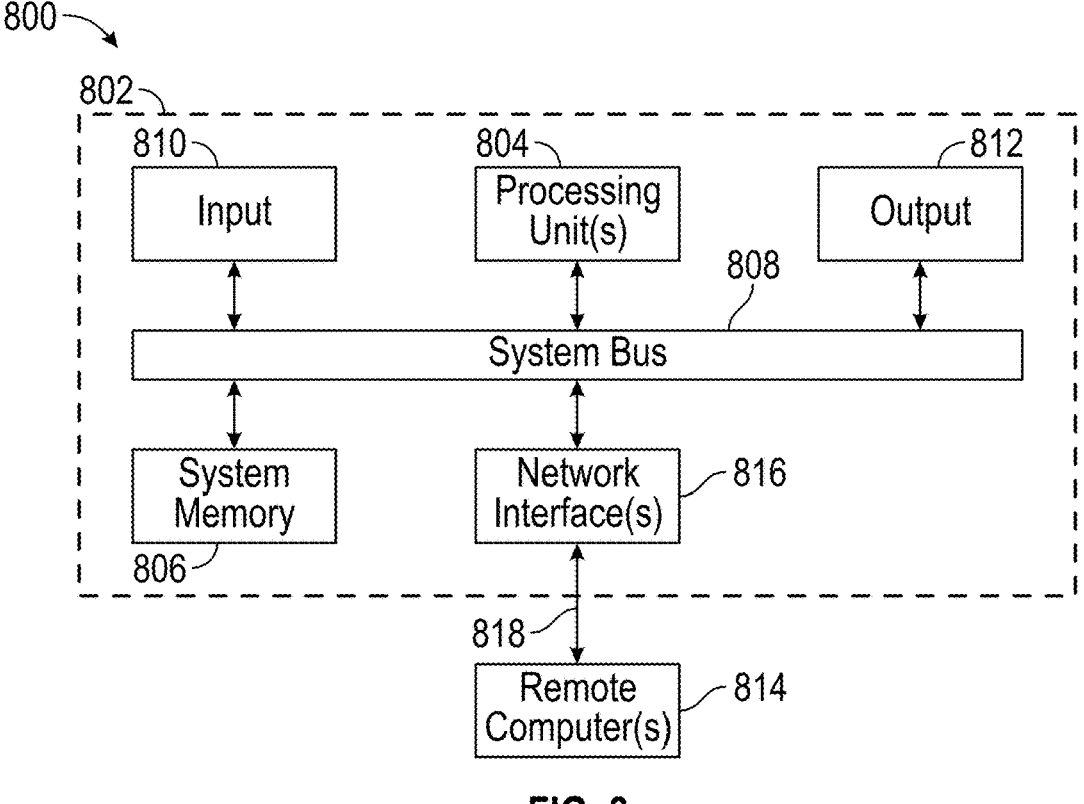
FIG. 8 is an illustration of a schematic diagram of an example computing environment for implementing one or more aspects described herein.

FIG. 8 illustrates an example of a suitable computing system environment 800 in which one or aspects of the aspects described in this disclosure can be implemented. Components of computer 802 can include, but are not limited to, a processing unit 804, a system memory 806, and a system bus 808 that couples various system components including the system memory to the processing unit 804.

Computer 802 typically includes a variety of computer readable media and can be any available media that can be accessed by computer 802. The system memory 806 can include computer storage media in the form of volatile or nonvolatile memory such as read only memory (ROM) or random access memory (RAM). By way of example, and not limitation, memory 806 can also include an operating system, application programs, other program components, and program data.

A user can enter commands and information into the computer 802 through input devices 810 (e.g., keyboard, keypad, a pointing device, a mouse, stylus, touchpad, touch screen, motion detector, camera, microphone or any other device that allows the user to interact with the computer 802). A monitor or other type of display device can be also connected to the system bus 808 via an interface, such as output interface 810. In addition to a monitor, computers can also include other peripheral output devices such as speakers and a printer, which can be connected through output interface 816.

The computer 802 can operate in a networked or distributed environment using logical connections to one or more other remote computers, such as remote computer 814. The remote computer 814 can be a personal computer, a server, a router, a network PC, a peer device or other common network node, or any other remote media consumption or transmission device, and can include any or all of the elements described above relative to the computer 802. The logical connections depicted in FIG. 8 include a network 818, such local area network (LAN) or a wide area network (WAN), but can also include other networks/buses e.g., cellular networks.

Computing devices typically include a variety of media, which can include computer-readable storage media or communications media, in which these two terms are used herein differently from one another as follows. Computer-readable storage media can be any available storage media that can be accessed by the computer, can be typically of a non-transitory nature, and can include both volatile and nonvolatile media, removable and non-removable media. By way of example, and not limitation, computer-readable storage media can be implemented in connection with any method or technology for storage of information such as computer-readable instructions, program components, structured data, or unstructured data. Computer-readable storage media can include, but are not limited to, RAM, ROM, electrically erasable programmable read only memory (EEPROM), flash memory or other memory technology, or other tangible or non-transitory media which can be used to store desired information. Computer-readable storage media can be accessed by one or more local or remote computing devices, e.g., via access requests, queries or other data retrieval protocols, for a variety of operations with respect to the information stored by the medium. In various aspects, the computer-readable storage media can be, or be included within, the memory, contact lens (or components thereof) or transmitter/receiver described herein.

On the other hand, communications media typically embody computer-readable instructions, data structures, program components or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals.

It is to be understood that the aspects described in this disclosure can be implemented in hardware, software, firmware, middleware, microcode, or any combination thereof. For a hardware aspect, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors or other electronic units designed to perform the functions described in this disclosure, or a combination thereof.

For a software aspect, the techniques described in this disclosure can be implemented with components or components (e.g., procedures, functions, and so on) that perform the functions described in this disclosure. The software codes can be stored in memory units and executed by processors.

What has been described above includes examples of one or more aspects. It is, of course, not possible to describe every conceivable combination of components or methodologies for purposes of describing the aforementioned aspects, but one of ordinary skill in the art can recognize that many further combinations and permutations of various aspects are possible. Accordingly, the described aspects are intended to embrace all such alterations, modifications and variations that fall within the spirit and scope of the appended claims.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The aforementioned systems have been described with respect to interaction between several components. It can be appreciated that such systems and components can include those components or specified sub-components. Sub-components can also be implemented as components communicatively coupled to other components rather than included within parent components (hierarchical). Additionally, it is to be noted that one or more components can be combined into a single component providing aggregate functionality. Any components described in this disclosure can also interact with one or more other components not specifically described in this disclosure but generally known by those of skill in the art.

In view of the example systems described above methodologies that can be implemented in accordance with the described subject matter will be better appreciated with reference to the flowcharts of the various figures. While for purposes of simplicity of explanation, the methodologies are shown and described as a series of blocks, it is to be understood and appreciated that the claimed subject matter is not limited by the order of the blocks, as some blocks can occur in different orders or concurrently with other blocks from what is depicted and described in this disclosure. Where non-sequential, or branched, flow is illustrated via flowchart, it can be appreciated that various other branches, flow paths, and orders of the blocks, can be implemented which achieve the same or a similar result. Moreover, not all illustrated blocks may be required to implement the methodologies described in this disclosure after.

In addition to the various aspects described in this disclosure, it is to be understood that other similar aspects can be used or modifications and additions can be made to the described aspect(s) for performing the same or equivalent function of the corresponding aspect(s) without deviating there from. Still further, multiple processing chips or multiple devices can share the performance of one or more functions described in this disclosure, and similarly, storage can be provided across a plurality of devices. The invention is not to be limited to any single aspect, but rather can be construed in breadth, spirit and scope in accordance with the appended claims.

What is claimed is:

1. A contact lens, comprising:
a transparent substrate; and
a circuit comprising:
one or more sensors disposed on or within the substrate;
circuitry disposed on or within at least a portion of the substrate;
one or more photovoltaic cells disposed on or within at least a portion of the substrate; and
a hybrid power component that supplies three or more different types of power to the circuitry, wherein a first type of power is solar power by the one or more photovoltaic cells and wherein a second type of power is power provided by one or more microelectromechanical systems, and wherein a third type of power is inductive power, wherein the inductive power comprises an inductive power component that receives radiofrequency energy of about 2.4 GHZ in response to insufficient power from solar power,
wherein the hybrid power component receives power by the one or more microelectromechanical systems in response to insufficient power from solar power by the one or more photovoltaic cells.

2. The contact lens of claim 1, wherein the hybrid power component supplies power intermittently, continually, or periodically.

3. The contact lens of claim 1, further comprising a power storage component, operably coupled to the one or more photovoltaic cells, that stores power from the one or more photovoltaic cells or the one or more microelectromechanical systems, or both.

4. The contact lens of claim 3, wherein the power storage component comprises a rechargeable ceramic battery.

5. The contact lens of claim 1, wherein the one or more photovoltaic cells are translucent or transparent.

6. The contact lens of claim 1, wherein at least one of the one or more photovoltaic cells or the circuitry is disposed along a perimeter of the substrate.

7. The contact lens of claim 1, wherein the one or more photovoltaic cells comprise at least one graphene photovoltaic cell.

8. The contact lens of claim 1, wherein the circuit comprises one or more sensors disposed on or within the transparent substrate.

9. The contact lens of claim 8, wherein the one or more sensors sense at least one of pressure, light, acceleration, or temperature.

10. The contact lens of claim 9, the contact lens further comprising a communication component, wherein the communication component transmits to or receives information from the one or more sensors.

11. A method of operating a contact lens, comprising:
supplying, from a hybrid power component on or within the contact lens, three or more different types of power to circuitry disposed on or within the contact lens, wherein a first type of power is solar power by one or more photovoltaic cells disposed on or within the contact lens, wherein a second type of power is power provided by one or more microelectromechanical systems, wherein the hybrid power component receives power by the one or more microelectromechanical systems in response to insufficient power from solar power by the one or more photovoltaic cells, and wherein a third type of power is inductive power, wherein the inductive power comprises an inductive power component that receives radiofrequency energy of about 2.4 GHz in response to insufficient power from solar power; and
performing one or more operations, by the circuitry, in response to receiving supplied power from the hybrid power component.

12. The method of claim 11, wherein the supplying comprises selectively supplying the three different types of power to the circuitry.

13. The method of claim 11, wherein the three or more different types of power are supplied based on an environment outside of the contact lens.

14. The method of claim 11, wherein the three or more different types of power are supplied at least one of intermittently, periodically, or continually.

15. The method of claim 11, wherein the hybrid power component receives power from a power storage component operably coupled to at least one of the three or more different types of power.

16. The method of claim 15, wherein the power storage component is operably coupled to and stores power from the one or more photovoltaic cells.

17. The method of claim 7, wherein the supplying the three or more different types of power comprises supplying the solar power during a first type of operation performed by the circuitry, supplying the second type of power by the one or more microelectromechanical systems during a second type of operation performed by the circuitry, and supplying a third type of power during a third type of operation performed by the circuitry.

* * * * *